US011269373B2

(12) United States Patent
Mautner et al.

(10) Patent No.: US 11,269,373 B2
(45) Date of Patent: Mar. 8, 2022

(54) BYZANTINE FAILOVER OF CLOCK SYNCHRONIZATION

(71) Applicant: THE CHARLES STARK DRAPER LABORATORY, INC., Cambridge, MA (US)

(72) Inventors: Eric Karl Mautner, Hudson, MA (US); Brianna Klingensmith, Arlington, MA (US)

(73) Assignee: THE CHARLES STARK DRAPER LABORATORY, INC., Cambridge, MA (US)

( * ) Notice: Subject to any disclaimer, the term of this patent is extended or adjusted under 35 U.S.C. 154(b) by 246 days.

(21) Appl. No.: 16/522,175

(22) Filed: Jul. 25, 2019

(65) Prior Publication Data

US 2020/0097041 A1  Mar. 26, 2020

Related U.S. Application Data

(60) Provisional application No. 62/736,585, filed on Sep. 26, 2018, provisional application No. 62/736,579, filed on Sep. 26, 2018, provisional application No. 62/736,592, filed on Sep. 26, 2018, provisional application No. 62/736,589, filed on Sep. 26, 2018.

(51) Int. Cl.
| | | |
|---|---|---|
| G06F 1/12 | (2006.01) | |
| G06F 1/14 | (2006.01) | |
| H04L 7/00 | (2006.01) | |
| G06F 13/12 | (2006.01) | |
| H03L 7/081 | (2006.01) | |
| H03L 7/099 | (2006.01) | |

(52) U.S. Cl.
CPC ............... G06F 1/14 (2013.01); G06F 1/12 (2013.01); G06F 13/122 (2013.01); H03L 7/0814 (2013.01); H03L 7/0991 (2013.01); H04L 7/0025 (2013.01); H04L 7/0037 (2013.01)

(58) Field of Classification Search
CPC . G06F 1/14; G06F 13/122; G06F 1/12; H03L 7/0814; H03L 7/0991; H04L 7/0025; H04L 7/0037; H04J 3/0676
USPC ........................................................ 713/400
See application file for complete search history.

(56) References Cited

U.S. PATENT DOCUMENTS

| | | | | |
|---|---|---|---|---|
| 5,557,623 | A * | 9/1996 | Discoll ..................... | G06F 1/14 714/797 |
| 8,675,665 | B2 * | 3/2014 | Umayabashi ......... | H04J 3/0632 370/395.62 |
| 10,205,586 | B2 * | 2/2019 | Paul ....................... | H04L 7/033 |
| 10,423,468 | B2 * | 9/2019 | Doyle .................... | G06F 9/542 |
| 2009/0040920 | A1 * | 2/2009 | Malekpour ............. | G06F 1/12 370/216 |
| 2009/0102534 | A1 * | 4/2009 | Schmid ................... | G06F 1/04 327/292 |

(Continued)

OTHER PUBLICATIONS

Watt, Steve T. et al., "Understanding and Applying Precision Time Protocol", Saudi Arabia Smart Grid 2015, Jeddah, Saudi Arabia, Dec. 7-9, 2015, pp. 1-8.

*Primary Examiner* — Volvick Derose
(74) *Attorney, Agent, or Firm* — Lando & Anastasi, LLP

(57) ABSTRACT

The present disclosure relates to systems and methods to maintain clock synchronization of multiple computers, or computer systems, through the exchange of communication messages that include clock and/or timing information.

20 Claims, 7 Drawing Sheets

(56) References Cited

U.S. PATENT DOCUMENTS

| | | | |
|---|---|---|---|
| 2010/0019811 A1* | 1/2010 | Malekpour | G06F 1/14 327/144 |
| 2012/0030495 A1* | 2/2012 | Chandhoke | G06F 1/10 713/400 |
| 2012/0221889 A1* | 8/2012 | Beilin | G06F 11/1679 714/12 |
| 2015/0071309 A1* | 3/2015 | Aweya | H04J 3/0682 370/503 |
| 2015/0092797 A1* | 4/2015 | Aweya | H04J 3/0667 370/516 |
| 2015/0110231 A1 | 4/2015 | Alexander et al. | |
| 2016/0095078 A1* | 3/2016 | Yamada | H04L 12/437 370/242 |
| 2016/0197719 A1* | 7/2016 | Wang | H04L 7/04 709/248 |
| 2017/0064606 A1* | 3/2017 | Lam | H04L 45/125 |
| 2017/0288801 A1* | 10/2017 | Aweya | H04W 56/001 |
| 2019/0036631 A1* | 1/2019 | Markovic | H04W 56/0055 |

* cited by examiner (1)

BYZANTINE FAILOVER OF CLOCK SYNCHRONIZATION

CROSS-REFERENCE TO RELATED APPLICATIONS

This application claims priority to U.S. Provisional Application Ser. No. 62/736,579, titled "ASYNCHRONOUS TIMING EXCHANGE FOR REDUNDANT CLOCK SYNCHRONIZATION," filed on Sep. 26, 2018, U.S. Provisional Application Ser. No. 62/736,585, titled "MULTI-DEVICE ASYNCHRONOUS TIMING EXCHANGE FOR REDUNDANT CLOCK SYNCHRONIZATION," filed on Sep. 26, 2018, U.S. Provisional Application Ser. No. 62/736,589, titled "BYZANTINE ASYNCHRONOUS TIMING EXCHANGE FOR MULTI-DEVICE CLOCK SYNCHRONIZATION," filed on Sep. 26, 2018, and U.S. Provisional Application Ser. No. 62/736,592, titled "BYZANTINE FAILOVER OF CLOCK SYNCHRONIZATION," filed on Sep. 26, 2018, each of which is incorporated herein by reference in its entirety.

FEDERALLY SPONSORED RESEARCH

This invention was made with government support under Contract No. NNJ16GX07B awarded by NASA. The government has certain rights in the invention.

BACKGROUND

Various computing devices may include clocks. Computing devices' clocks control certain aspects of operation of the computing devices. For example, a clock rate of a clock may control a frequency at which components of the computing devices operate.

SUMMARY OF INVENTION

According to aspects of the disclosure, a computing system is provided including an oscillator configured to provide an oscillating signal, a counter coupled to the oscillator and configured to maintain a running total of cycles of the oscillating signal, the running total of cycles being a system clock, a communications interface configured to send and receive information, and a processing component configured to communicate with at least two other computing systems, determine a time differential with respect to each of the at least two other computing systems, maintain a synchronized clock with a selected one of the at least two other computing systems, monitor for a failure criterion with respect to the selected computing system, and provide, to the at least two other computing systems responsive to detecting the failure criterion, a vote to re-synchronize the synchronized clock with an alternate one of the at least two other computing systems other than the selected one of the at least two other computing systems.

In some examples, the processing component is further configured to transmit and receive communications with the at least two other computing systems about an identity of the selected computing system to serve as a leader clock, establish the selected computing system as the leader clock based upon a voting scheme associated with the communications, and maintain the synchronized clock based upon the system clock and an offset to the leader clock. In various examples, the processing component is further configured to maintain the synchronized clock based upon the system clock and a first offset value derived from time differentials with respect to the selected computing system, and replace the first offset value with a second offset value derived from time differentials with respect to the alternate computing system responsive to detecting the failure criterion.

In at least one example, the processing component is further configured to derive the first offset value based upon a first time differential to the selected computing system and a second time differential from the selected computing system. In some examples, the processing component is further configured to derive the first offset value as an average of the first time differential and the second time differential. In various examples, the processing component is further configured to maintain derived values of the first offset value and the second offset value simultaneously.

In some examples, the processing component is further configured to re-synchronize the synchronized clock with the selected one of the at least two other computing systems responsive to receiving, from the at least two other computing systems, at least two votes to remain synchronized with the selected one of the at least two other computing systems. In at least one example, the failure criterion is satisfied where a rate at which the first offset value changes exceeds a threshold.

According to some aspects of the disclosure, a method of operating a computing system having a system clock is provided, the method comprising communicating with at least two other computing systems, determining a time differential with respect to each of the at least two other computing systems, maintaining a synchronized clock with a selected one of the at least two other computing systems, monitoring for a failure criterion with respect to the selected computing system, and providing, to the at least two other computing systems responsive to detecting the failure criterion, a vote to re-synchronize the synchronized clock with an alternate one of the at least two other computing systems other than the selected one of the at least two other computing systems.

In some examples, the method includes transmitting and receiving communications with the at least two other computing systems about an identity of the selected computing system to serve as a leader clock, establishing the selected computing system as the leader clock based upon a voting scheme associated with the communications, and maintaining the synchronized clock based upon the system clock and an offset to the leader clock. In various examples, the method includes maintaining the synchronized clock based upon the system clock and a first offset value derived from time differentials with respect to the selected computing system, and replacing the first offset value with a second offset value derived from time differentials with respect to the alternate computing system responsive to detecting the failure criterion.

In various examples, the method includes deriving the first offset value based upon a first time differential to the selected computing system and a second time differential from the selected computing system. In some examples, the method includes deriving the first offset value as an average of the first time differential and the second time differential. In at least one example, the method includes maintaining derived values of the first offset value and the second offset value simultaneously.

In at least one example, the method includes re-synchronizing the synchronized clock with the selected one of the at least two other computing systems responsive to receiving, from the at least two other computing systems, at least two votes to remain synchronized with the selected one of the at least two other computing systems. In various examples, the method includes re-synchronizing the synchronized clock with the alternate one of the at least two other computing systems responsive to determining that a rate at which the first offset value changes exceeds a threshold.

According to aspects of the disclosure, a non-transitory computer-readable medium storing thereon sequences of computer-executable instructions for operating a computing system having a system clock is provided, the sequences of computer-executable instructions including instructions that instruct at least one processor to communicate with at least two other computing systems, determine a time differential with respect to each of the at least two other computing systems, maintain a synchronized clock with a selected one of the at least two other computing systems, monitor for a failure criterion with respect to the selected computing system, and provide, to the at least two other computing systems responsive to detecting the failure criterion, a vote to re-synchronize the synchronized clock with an alternate one of the at least two other computing systems other than the selected one of the at least two other computing systems.

In some examples, the instructions are further configured to instruct the at least one processor to transmit and receive communications with the at least two other computing systems about an identity of the selected computing system to serve as a leader clock, establish the selected computing system as the leader clock based upon a voting scheme associated with the communications, and maintain the synchronized clock based upon the system clock and an offset to the leader clock.

In various examples, the instructions are further configured to instruct the at least one processor to maintain the synchronized clock based upon the system clock and a first offset value derived from time differentials with respect to the selected computing system, and replace the first offset value with a second offset value derived from time differentials with respect to the alternate computing system responsive to detecting the failure criterion. In at least one example, the instructions are further configured to instruct the at least one processor to derive the first offset value based upon a first time differential to the selected computing system and a second time differential from the selected computing system.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures may be represented by a like or similar numeral. For purposes of clarity, not every component may be labeled in every figure. In the figures.

DETAILED DESCRIPTION

Figure 1:
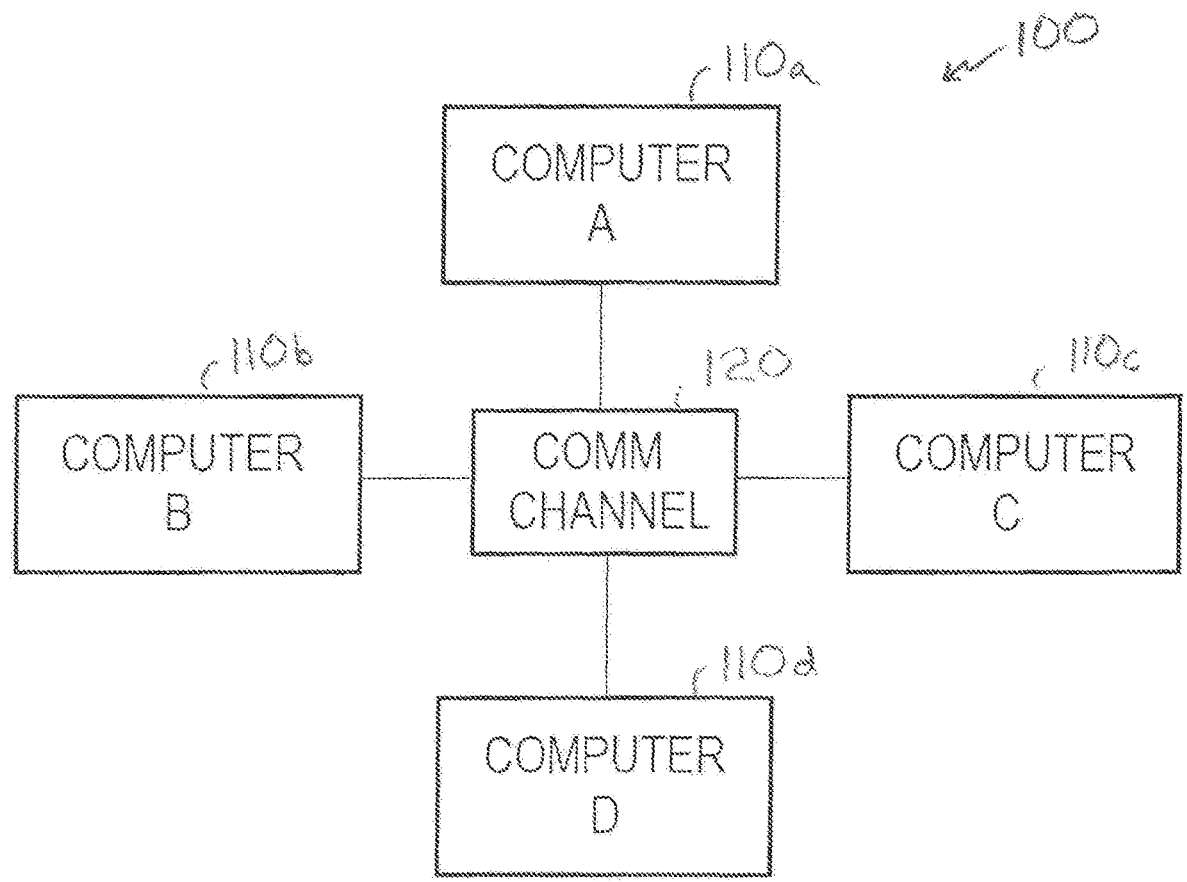
FIG. 1 is a schematic block diagram of an example fault tolerant computing system.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

With the rapid technological developments in areas such as aviation, space travel, robotics, medical devices, and electronic financial systems, there is an increasing need for computer systems to be reliable and resilient to failure. Thus, there is an ever-growing demand for reliable computing systems. Replicated computers executing redundant operations can provide fault tolerance by comparing the outputs of each of the computers and excluding any that may have generated an error during operation.

A fault-tolerant parallel processor (FTPP) architecture may provide replicated operation of processing elements, and may provide synchronization and data integrity functions. Such high-reliability systems include redundant computers such that the system may continue operation in light of a failure of one (or more) of the computers. In such systems, various computing elements may need to maintain a synchronized clock and/or provide for clock synchronization between the multiple redundant computers.

Fault-tolerant computing systems are designed to continue operating properly in the event of a failure of one or more components. Fault-tolerant systems can be robust to several possible types of failures, including but not limited to hard disk failures, input or output device failures, software bugs and errors, interface errors, operator errors, bad command sequences, single event upsets, single event latch-ups, and physical damage. Fault tolerant systems are useful in machines built to last a long time without any maintenance, such as space systems; computers that must be very dependable and require constant monitoring, such as monitor and control computers for nuclear power plants or supercollider experiments; and computers with high run-times and heavy use, such as supercomputers for probability monitoring. However, the computing systems disclosed herein are not limited to these types of applications.

Referring to FIG. 1, there is illustrated a block diagram of a computing system 100 that includes four computers (or sub-systems) 110 and a communications channel 120 that allows the four computers 110 to communicate with each other. Various embodiments may include more or fewer than four computers. A system having more computers 110 may generally be capable of acceptable operation under conditions of multiple or more faults than a system of fewer computers 110. Accordingly, various embodiments of a computing system similar to the system 100 may have any number of computers and may be designed to accommodate various types or number of faults without departure from the aspects and embodiments described herein. The communications channel 120 may be of any suitable type, and may include a shared medium (for example, such that when any of the computers transmits all the computers are capable of receiving) or may include dedicated media (for example, individual point-to-point communications channels between each pair of the computers, such as a mesh network).

In various embodiments, each of the computers 110 includes a synchronization component that maintains a synchronized clock with the other of the computers 110. Accordingly, each of the computers 110 (when properly functioning) may include a synchronized clock that matches a similar synchronized clock in all of the other computers 110, within some tolerance or variance criterion. Various embodiments of systems and methods described herein provide a capability to maintain the synchronized clocks in a synchronized status.

Each of the computers 110 may include an internal or system clock, which may not be synchronized with the internal or system clocks of the other computers 110. Each of the system clocks may be driven or provided by an oscillator, for example, a local oscillator (LO), that provides an oscillating signal of a certain degree of stability, for example, accuracy, precision, to a counter that maintains a running total of the number of cycles of the oscillating signal, to within a maximum count at which time the counter may "rollover" to start again at zero. Accordingly, a counter driven by an oscillator may be a system clock that maintains a reference time (for example, in number of oscillator cycles). For example, in at least one embodiment, a local oscillator may be included to provide an oscillating signal (or clock signal) at a nominal frequency of 35 MHz, with an accuracy of +/−50 ppm, and a counter having 48 bits of resolution may count the clock cycles of the oscillating signal. Accordingly, such a 48-bit counter driven by a 35 MHz oscillator increments by 35,000,000 every second and rolls over (for example, to start again at zero) approximately every 3 months (91.31 days). The value provided by the counter at any given time is the system clock.

To maintain a synchronized clock, each of the computers 110, or the synchronization component of each of the computers 110, may maintain an offset value that when added to the respective system clock provides the synchronized clock. In various embodiments, two separate oscillators, respectively of two of the computers 110, may be well-matched in that their frequencies have only a slight variance, and thus an offset value for the system clock of one of the computers to be "adjusted" to provide a synchronized clock (for example, synchronized with the other of the computers) may be substantially constant. By contrast, a slowly changing offset value (for example, slowly increasing or decreasing over time) suggests that one of the oscillators runs faster than the other. An offset value that changes over time, but within an accepted rate of change (for example, implying that the oscillators of two computers 110 are not running at exactly the same frequency), is accommodated by the systems and methods described herein.

In various embodiments, however, a rapidly changing offset value and/or an offset value that changes drastically from one moment to the next and/or changes at highly varying rates over time may indicate that the system clock (for example, the oscillator, counter, or other component) of at least one of the computers 110 is malfunctioning. Accordingly, systems and methods described herein may reject or ignore the clocking information from such a malfunctioning one of the computers 110. For example, at various times, all the computers 110 may maintain a synchronized clock that is synchronized to a system clock of a particular one of the computers 110, which is thereby the leader. In other words, each of the computers 110 may maintain a synchronized clock that is synchronized to a leader, and the leader may be a particular one of the computers 110. Accordingly, if the system clock of the leader is detected to be malfunctioning (for example, by errant behavior of the offset value described above), a new one of the computers 110 may be selected to be a new leader, and the various computers 110 may begin synchronizing with the new leader.

Figure 2:
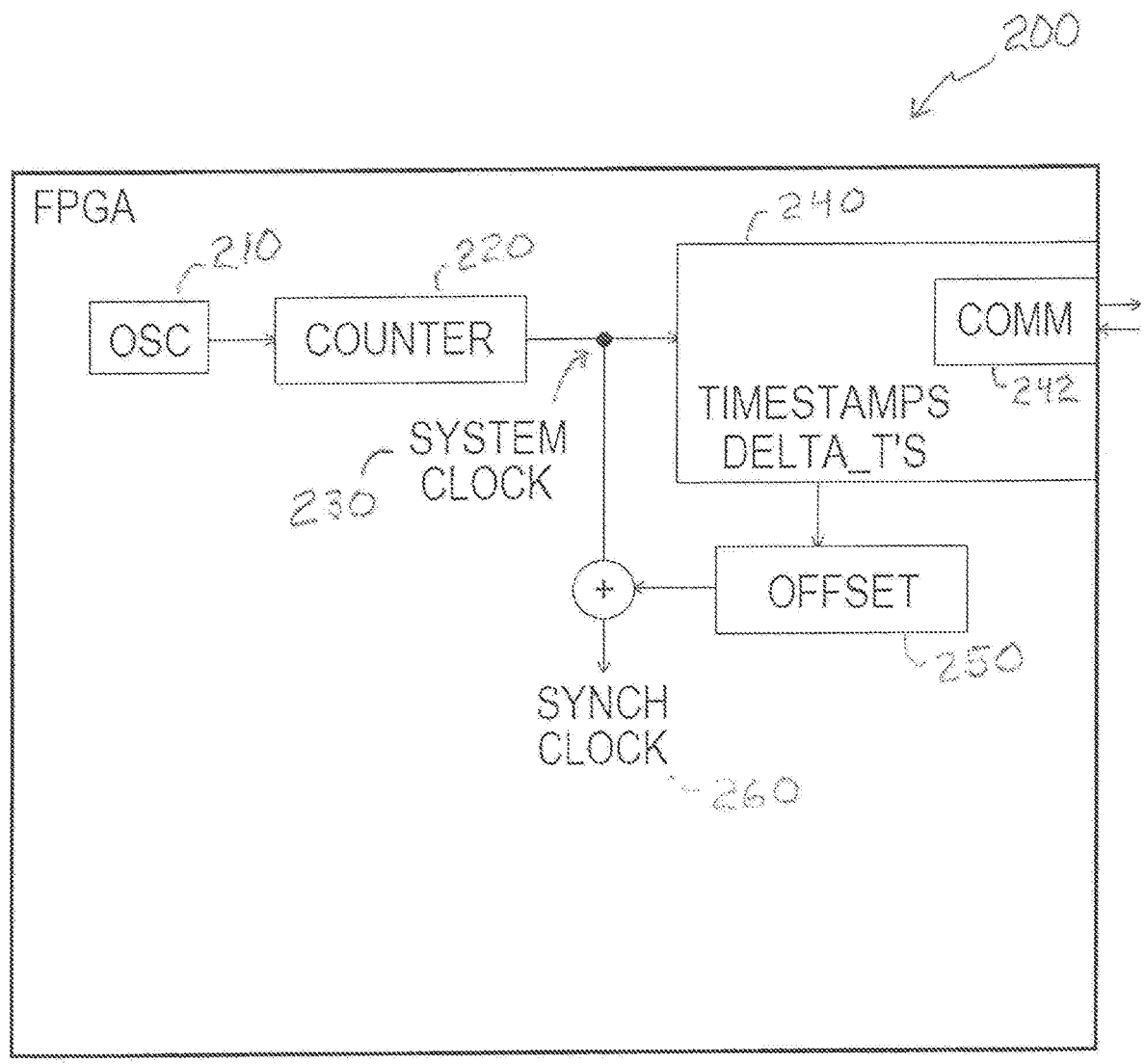
FIG. 2 is a schematic block diagram of an example component of a computer of a fault tolerant computing system.

FIG. 2 illustrates a block diagram of a component 200 that may be responsible for maintaining a synchronized clock in certain embodiments. In some embodiments, the component 200 may be implemented in a hardware form, such as an application-specific integrated circuit (ASIC) or as a field-programmable gate array (FPGA). For example, such hardware embodiments, or the like, may exhibit consistent processing times that contribute to accuracy of the synchronized clock. Other embodiments, however, may include varying degrees of hardware implementation and may include software or firmware instructions to be processed by a more generic processing component.

In various embodiments, the component 200 may include an oscillator 210 that drives a counter 220 to provide a system clock 230 (as described above). A timing sub-component 240 may maintain communications with others of the computers 110 (for example, via a communication interface 242 that couples to the communications channel 120) to determine an offset 250 that when added to the system clock 230 yields a synchronized clock 260. The offset 250 may, at various times, be a positive or negative value, for example, based upon whether the system clock 230 is behind or ahead of the leader's clock, respectively. The timing sub-component 240 communicates with the leader (for example, another one of the computers 110) to determine the proper value of the offset 250 that will cause the system clock 230 to "synchronize" with the leader's clock when modified by the offset 250, for example, by adding the offset 250 to the system clock 230, to provide the synchronized clock 260. In various examples, if the component 200 is a part of the computer 110 that is the leader, the offset may be zero, for example, because the system clock 230 of the leader is the synchronized clock 260. Accordingly, the leader's system clock 230 does not need to be modified.

Operation of the timing sub-component 240 is described to illustrate, in at least one embodiment, how a value is determined for the offset 250. At an example time, the computer 110a may be the leader to which the other computers 110 are to synchronize their clocks. Accordingly, each of the other computers 110b, 110c, 110d carries out communications that allow determination (as described in greater detail below) of a respective offset 250 having a value that, when added to their respective system clock 230, provides a synchronized clock 260 that is synchronized with the system clock 230 of the leader computer 110a. Accordingly, the synchronized clock 260 maintained at each respective computer 110 will be synchronized with each of the synchronized clocks 260 at the other of the computers 110.

In at least one embodiment, each of the computers 110 includes a component 200 responsible for maintaining the synchronized clock 260. As for timing information communicated over the communications channel 120, such may be variously described herein as being an equivalent communication by any of the computer 110, the synchronization component 200 of the respective computer 110, or the timing sub-component 240 of the respective component 200. Accordingly, timing data and/or information communicated by and between any of the computers 110 may be communicated by and between respective components 200 and sub-components 240 of the computers 110, for example, via respective communication interfaces 242 and conveyed by the communications channel 120. For ease of illustration herein, the communications channel 120 is exemplified herein as providing conveyance from each of the computers 110 to every other of the computers 110 at once (for example, such as a shared media), but dedicated channels between individual pairs of the computers 110 are capable of providing similar conveyance of transmitted data, as will be understood by one of skill in the art.

Returning to an example in time of the computer 110a being a leader to which the other computers 110 will synchronize, an illustrative description of the operation of the computer 110b to synchronize with the computer 110a is presented. Accordingly, the computer 110b (for example, via a respective component 200) operates to provide a synchronized clock 260 which matches, within some variance or tolerance criterion, with the system clock 230 of the leader computer 110a.

Figure 3:
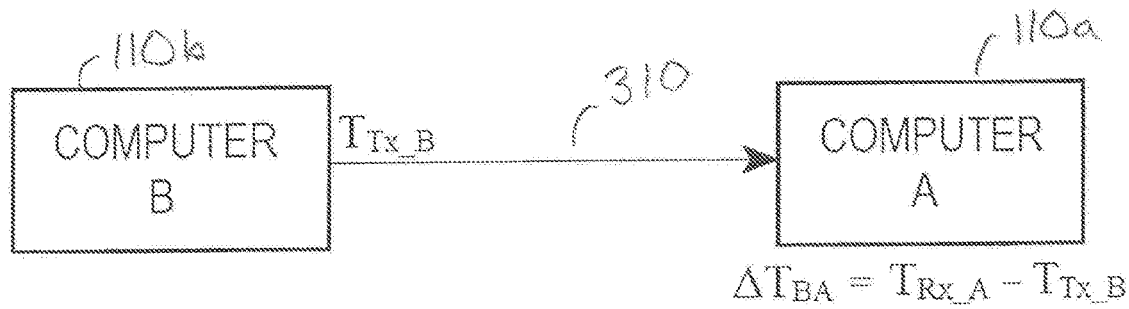
FIG. 3 is a schematic diagram of an example communications exchange of timing information between two example computers of a fault tolerant computing system.
Figure 3:
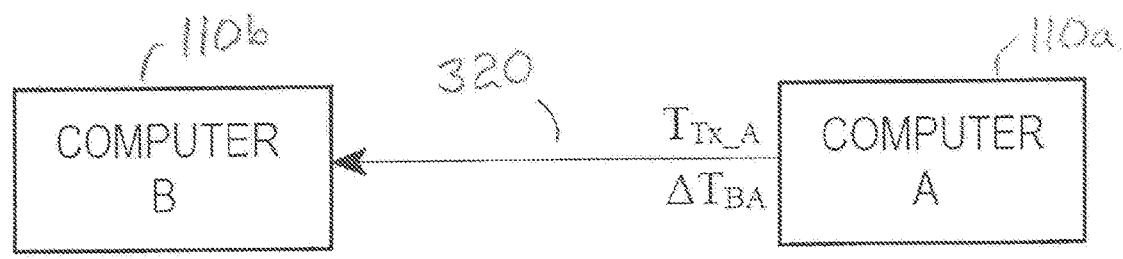

As illustrated by FIG. 3, the computer 110b transmits a communication 310 (for example, via a packet, frame, datagram, etc.) which includes the time of the transmission, $T_{Tx\_B}$, based upon the system clock 230 of the computer 110b. The leader computer 110a receives the transmission and determines a time differential ($\Delta T_{BA}$) value based on the receive time, $T_{Rx\_A}$, according to the leader's system clock 230. Accordingly, the time difference $\Delta T_{BA} = T_{Rx\_A} - T_{Tx\_B}$ represents the time difference as determined by computer A based on the received time (according to A's system clock 230) relative to the transmitted time (according to B's system clock 230). Further, the time difference $\Delta T_{BA}$ includes various processing and transmission times for the transmission from B to A and includes the offset of A's clock relative to B's clock (for example, if A's clock is ahead of B's clock, the amount by which A's clock is ahead is included in the $\Delta T_{BA}$ value determined by computer A; if A's clock is behind B's clock, the offset is still included but may be a negative value). Accordingly, while $\Delta T_{BA}$ may calculated by computer 110a as a difference between a pair of transmit and receive times, the value may be equivalently expressed as $\Delta T_{BA} = TT_{BA} + O_{BA}$, where $TT_{BA}$ is the transit time (including processing at each of the computers) for the information to transit from B to A, and $O_{BA}$ is the offset value of A's system clock 230 relative to B's system clock 230 (for example, positive if A is ahead of B, negative if A is behind B).

Further illustrated in FIG. 3, the computer 110a transmits a communication 320 that is received by the computer 110b. The communication 320 includes the time of the transmission, $T_{Tx\_A}$, based upon the system clock 230 of the computer 110a, and includes the time difference $\Delta T_{BA}$ that was determined by the computer 110a. Accordingly, the computer 110b may determine a new time difference, $\Delta T_{AB} = T_{Rx\_B} - T_{Tx\_A}$, that represents the time difference as determined by computer B based on the received time (according to B's system clock 230) relative to the transmitted time (according to A's system clock 230). Similar to the above time difference (from B to A) determined by the computer 110a, the new time difference (for example, from A to B) is determined by the computer 110b. Similar to the above, the new time difference may also be expressed as a transit time and an offset, $\Delta T_{AB} = TT_{AB} + O_{AB}$.

In various embodiments, the computers 110 are of identical or nearly identical nature. Accordingly, it may be presumed and/or may be enforced by design that processing and transmission of timing information from A to B may take approximately the same amount of time as processing and transmission of timing information from B to A, for example, $TT_{BA} \approx TT_{AB}$. Further, the offset of A's system clock relative to B's is the same as B's relative to A's, with opposite sign, for example, $O_{AB} = -O_{BA}$. Accordingly, subtracting the new time difference in one direction (for example, calculated by the computer 110b) from the earlier time difference in the opposite direction (for example, calculated by the computer 110a), may yield an approximate offset 250 to within a certain allowed variance criterion, as illustrated by Eq. (1).

$$\Delta T_{BA} - \Delta T_{AB} = (TT_{BA} + O_{BA}) - (TT_{AB} + O_{AB}) \approx 2 O_{BA} \quad (1)$$

Accordingly, after the exchange of the communications 310, 320, the computer 110b may calculate an offset 250 that may be added to the system clock 230 of the computer 110b to provide a synchronized clock 260 that is synchronized with the leader computer 110a. Similarly, each of the other computers 110 may carry out a similar exchange of communications with the computer 110a such that all the computers 110 are provided with a synchronized clock 260 which is synchronized with the leader computer 110a. Further, each of the computers 110 may at intervals conduct further exchange of communications, for example, similar to those illustrated in FIG. 3, such that each of the computers 110 may continuously update an appropriate offset 250 to the leader computer 110a to maintain their respective synchronized clock 260. For example, the offset 250 may drift due to the leader's system clock 230 being faster or slower than the system clock 230 of any respective other one of the computers 110. Accordingly, the value of an offset 250 indicates a difference in system clocks at a particular time, and a changing value of the offset 250 over time indicates a difference in clock rates (for example, oscillator frequency) between the leader computer 110a and a respective one of the other computers 110.

As described above, each of the computers 110 may maintain a respective synchronized clock 260 that is synchronized with a leader or master clock, such as the system clock 230 of the leader computer 110a. Each of the computers 110 exchanges messages with the leader (for example, computer 110a) and maintains ΔT values from itself to the leader and from the leader to itself, from which the respective computer 110 may calculate or determine an appropriate offset 250, as described above. Each respective computer 110 then maintains synchronization with the leader by adjusting a respective system clock 230 by the determined offset 250, as further described above. In some embodiments, timing information may be communicated, and ΔT values may be calculated and/or stored by a sub-component 240, as illustrated in FIG. 2, which may include processing capability for calculations and memory for storage of ΔT values and/or offset values. Various embodiments may communicate, calculate, determine, and store such information in differing ways.

According to various embodiments, a system similar to system 100 in FIG. 1 may establish a leader from among the computers 110 and may exchange timing information (as described above) to synchronize with the leader's clock. In further embodiments, the computers may maintain additional timing information to provide capability for a rapid recovery or failover to another one of the computers as a new leader, such as in case of failure of the leader computer.

Figure 4:
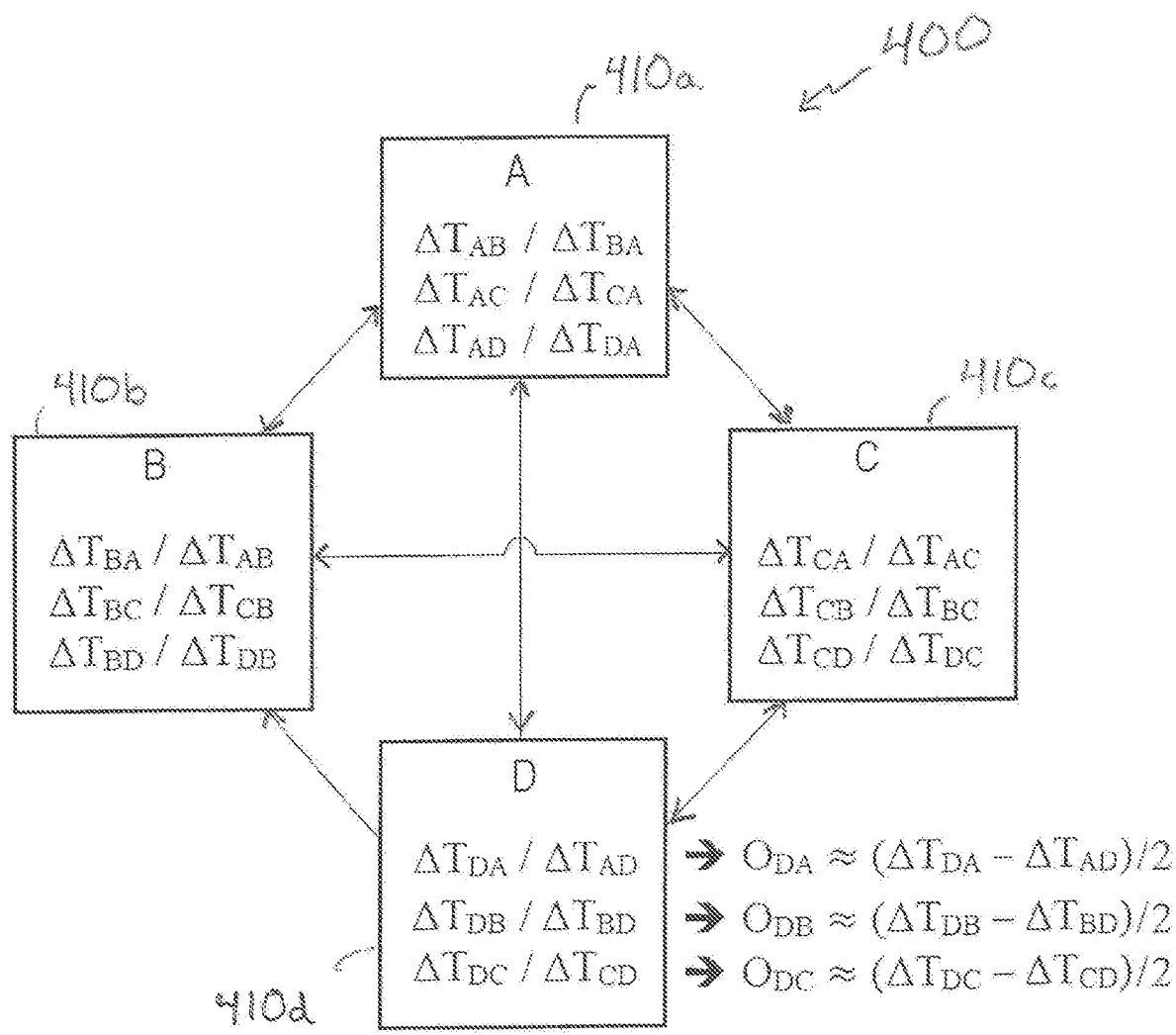
FIG. 4 is a schematic block diagram of another example fault tolerant computing system.

Illustrated in FIG. 4 is a block diagram of a system 400 that includes a number of computers 410 (as shown, four computers 410, but may include more or fewer computers in various embodiments), each of which maintains ΔT values relative to a number of the other computers 410 and not just relative to a leader. Accordingly, any of the computers 410 may "convert" or change their synchronized clock to be synchronized to any of the other computers at any moment, in a rapid time, and in as short as one clock cycle in some embodiments. Rapid failover to another leader clock is made possible because ΔT values and, optionally, offset values, to a plurality of the other computers 410 are maintained by the computers 410. For example, each of the computers 410 may determine ΔT values to each of the other computers 410 at regular intervals and store the ΔT values in a memory, such that the stored ΔT values are immediately available to calculate an offset value to synchronize with a different leader clock. In some embodiments, any of the computers 410 may at regular intervals calculate offset values to multiple of the other computers 410 (or other potential leader clocks), for example, from the stored ΔT values, and may store the calculated offset values such that the offset values are immediately available to synchronize with a different leader clock. Accordingly, the system 400 may quickly establish a new leader (for example, a selected one of the computers 410, or another clock source in various embodiments) and all be synchronized to the new leader with minimal delay.

For example, and with continued reference to FIG. 4, each of the computers 410 may maintain a table of ΔT values, the ΔT values being as described above and representative of one-way measured time differences that include transit time and offsets between the system clocks 230 of the respective computers 410. Accordingly, for the example of FIG. 4 with four computers 410, each of the computers 410 may maintain or store a table of six ΔT values, for example, a pair of ΔT values for each of the other (three) computers 410 to which it may need to synchronize. For example, the computer 410d maintains a first pair of ΔT values representing two-way time differentials between the computer 410d and the computer 410a, a second pair of ΔT values representing two-way time differentials between the computer 410d and the computer 410b, and a third pair of ΔT values representing two-way time differentials between the computer 410d and the computer 410c. Accordingly, the computer 410d may rapidly determine an offset to synchronize with any of the system clocks 230 of the computers 410a, 410b, 410c, and in some embodiments may maintain a table of such offset values, for example, by calculating the offset values at routine intervals based upon the ΔT values. Accordingly, rapid synchronization to any system clock is made possible by routine communication of timing information (for example, communications 310, 320 of FIG. 3) to multiple potential leaders to maintain a table of ΔT values and/or offset values. Accordingly, the system 400 may rapidly recover from a failure of a leader clock by re-synchronizing with a system clock of a new leader.

In various embodiments, a new leader or a "next leader" may be previously identified, configured, and/or agreed-upon among the computers 410, for example. For example, the computers 410 may be configured to follow a previously identified, configured, and/or agreed-upon order of leaders, such as an order in which a next leader after the computer 410a is the computer 410b, a next leader after the computer 410b is the computer 410c, a next leader after the computer 410c is the computer 410d, and a next leader after the computer 410d is the computer 410a.

In various embodiments, each of the computers may keep track of and communicate an identity of which of the computers is serving as the leader clock, whether the leader is running within specifications, and/or an identity of the next leader in the event of a failure of the leader.

Further, by communicating such information the member computers of the system may effectively vote for a leader, vote for a standby or next leader, and vote when to failover to the next leader.

Figure 5:
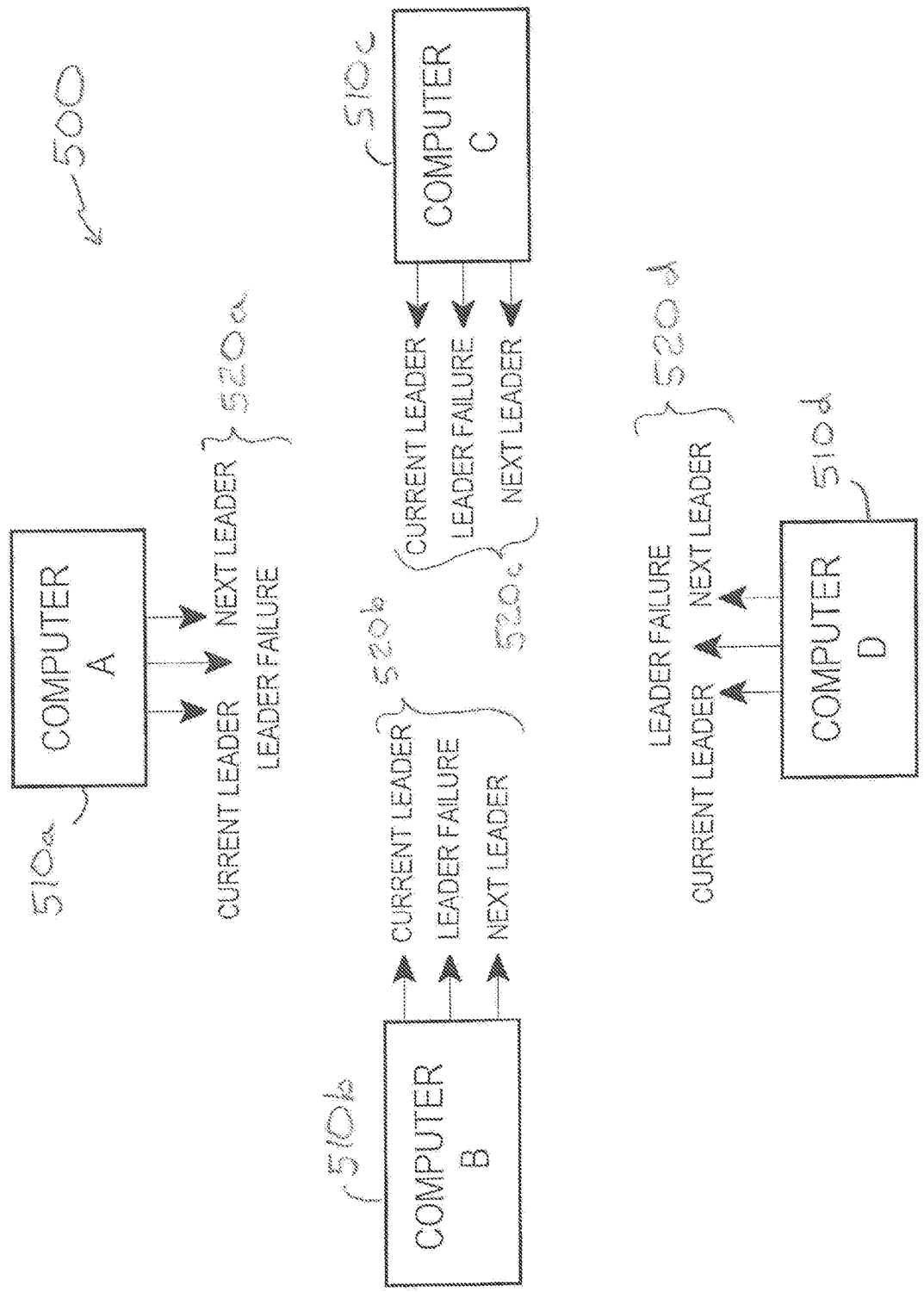
FIG. 5 is a schematic diagram of an example communications exchange of other information between computers of a fault tolerant computing system.

With reference to FIG. 5, an example system 500 is shown that is similar to the systems 100, 400 as described above. Each of the computers 510 communicate an identity of a current leader, an identity of a next leader, and whether the current leader is in failure and should be replaced by the next leader. Each of the computers 510 determines an offset 250 applied to its own system clock 230 to generate its synchronized clock 260 such that its synchronized clock 260 is synchronized to the current leader's system clock 230.

Accordingly, an identity of the "current leader" communicated by a respective computer 510 may be a declaration by the respective computer 510 that it is attempting to synchronize to said "current leader," even if the others of the computers 510 may be synchronizing to and declaring a different "current leader." However, in various embodiments, the messages 520 that declare a leader from the perspective of each computer 510 may be a voting mechanism for selecting (or confirming) the current leader. In various embodiments, a majority rule may apply such that any time a "current leader" as declared by a majority of the computers 510 fails to match the "current leader" of a particular one of the computers 510, the particular one of the computers 510 updates its identifier of the "current leader" to the majority voted current leader, and further the particular one of the computers 510 (for example, that was outvoted) adapts to synchronize its synchronized clock 260 to the leader's system clock 230.

Similarly, each of the computers 510 may vote, optionally by majority rule, for the identity of a "next leader" to be declared the "current leader" in the event of failure of the actual current leader.

With respect to offsets between various system clocks and stability of one or more system clocks, an offset value that remains constant implies two system clocks are running at the same rate, for example, neither is faster than the other.

An offset value that increases or decreases at a constant rate implies that one system clock is faster or slower than the other, respectively. An offset value that increases or decreases at a significant (though constant) rate may imply that one of the system clocks is out of specification, for example, running much faster or slower than its rated tolerance, and is failing to accurately keep time. An offset value that varies rapidly and/or erratically (for example, not at a constant increase or decrease) implies that at least one of the system clocks is not running at a constant rate and may be seriously out of specification, is failing, and/or has been compromised, for example, by environmental risks such as ionizing radiation. Accordingly, a failure criterion may be satisfied for a respective computer where the computer determines that a rate at which an offset value is changing, or a rate at which the rate at which the offset value is changing, exceeds a threshold. For example, a clock failure may be caused by a failure in either of the oscillator 210 or the counter 220, or in other components, such as by irradiation of a logic component, memory, register, etc.

In conventional systems, a single offset value maintained for synchronization to a leader clock may indicate a failure (for example, by increasing or decreasing rapidly or erratically) yet is incapable of indicating which clock is the source of the problem. For example, with respect to FIG. 1, if the computer 110b is synchronized to the computer 110a and an offset value indicates a clock error or failure, it is impossible for the computer 110b to determine whether its own system clock is out of specification or whether the leader clock (the computer 110a) is out of specification. With the advantage of aspects and embodiments described herein, however, various offset values to others of the computers may indicate which clock is out of specification.

Accordingly, each of the computers 510 may communicate, for example, in the messages 520, whether the current leader is failing, such as whether the current leader is failing to provide a reliable reference clock for synchronization (for example, as detected by rapidly changing and/or erratic $\Delta T$ values relative to the current leader's system clock 230, or based upon failed communications to the current leader, etc.). Accordingly, the messages 520 may represent a vote whether to declare the leader failed and thereby change to the next leader, for example, synchronize to the next leader and declare the next leader as the current leader. In various embodiments, each of the computers 510 may vote that the current leader is in a failure condition based upon an inability to reliably synchronize with the current leader and/or based upon a determination that others of the computers 510 are unable to synchronize, for example, based upon knowledge from the table of $\Delta T$ values maintained at each of the computers 510, or based upon other criteria.

Further in accord with the above, while each of the computers 410 is shown in FIG. 4 as maintaining six $\Delta T$ values (for example, for an example system of four computers 410), it should be noted that there are a total of twelve $\Delta T$ values illustrated because each of the six $\Delta T$ values maintained at any one of the computers 410 is also maintained at another one of the computers 410. For example, the $\Delta T$ value, $\Delta T_{AC}$, is maintained in memory at each of the computer 410a and the computer 410b.

Figure 6:
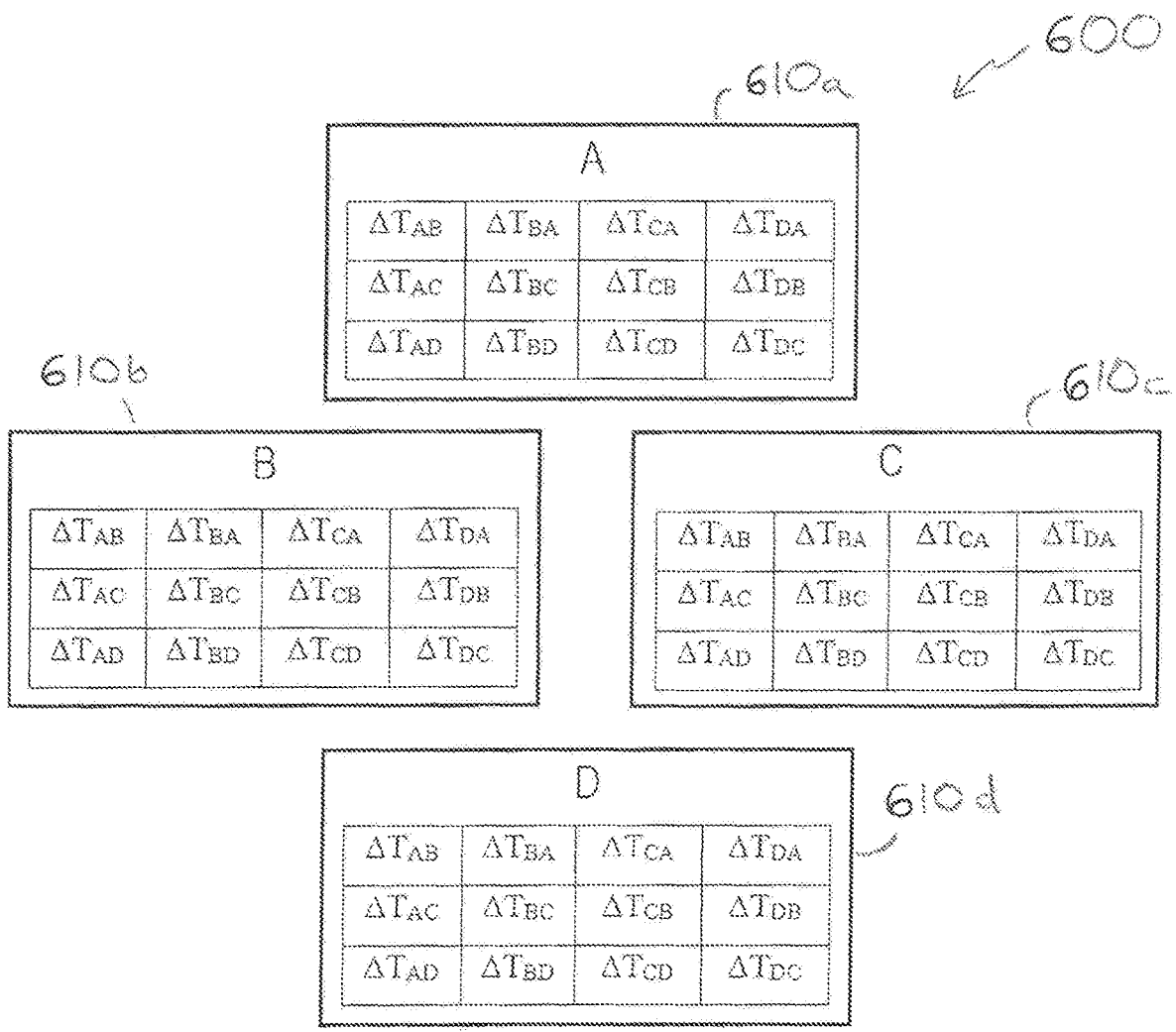
FIG. 6 is a schematic block diagram of another example fault tolerant computing system.

In some embodiments, each of the computers 410 may maintain a complete table of all the $\Delta T$ values in the system. Accordingly, with reference to FIG. 6, for an example system 600 having four computers 610, which is similar to the systems 100, 400, 500 as described above, a complete table of $\Delta T$ values may include:

TABLE 1

| $\Delta T_{AB}$ | $\Delta T_{BA}$ | $\Delta T_{CA}$ | $\Delta T_{DA}$ |
| $\Delta T_{AC}$ | $\Delta T_{BC}$ | $\Delta T_{CB}$ | $\Delta T_{DB}$ |
| $\Delta T_{AD}$ | $\Delta T_{BD}$ | $\Delta T_{CD}$ | $\Delta T_{DC}$ |

Accordingly, a complete set of $\Delta T$ values for a system in accord with aspects and embodiments described herein may include $N \times (N-1)$ values, where N is the number of computers in the system. In some embodiments, if one or more of the computers 610 experiences a failure, the remaining ones of the computers 610 may cease maintaining $\Delta T$ values with respect to the failed computer(s) 610. Accordingly, a complete table of $\Delta T$ values may at times be less than $N \times (N-1)$.

Figure 7:
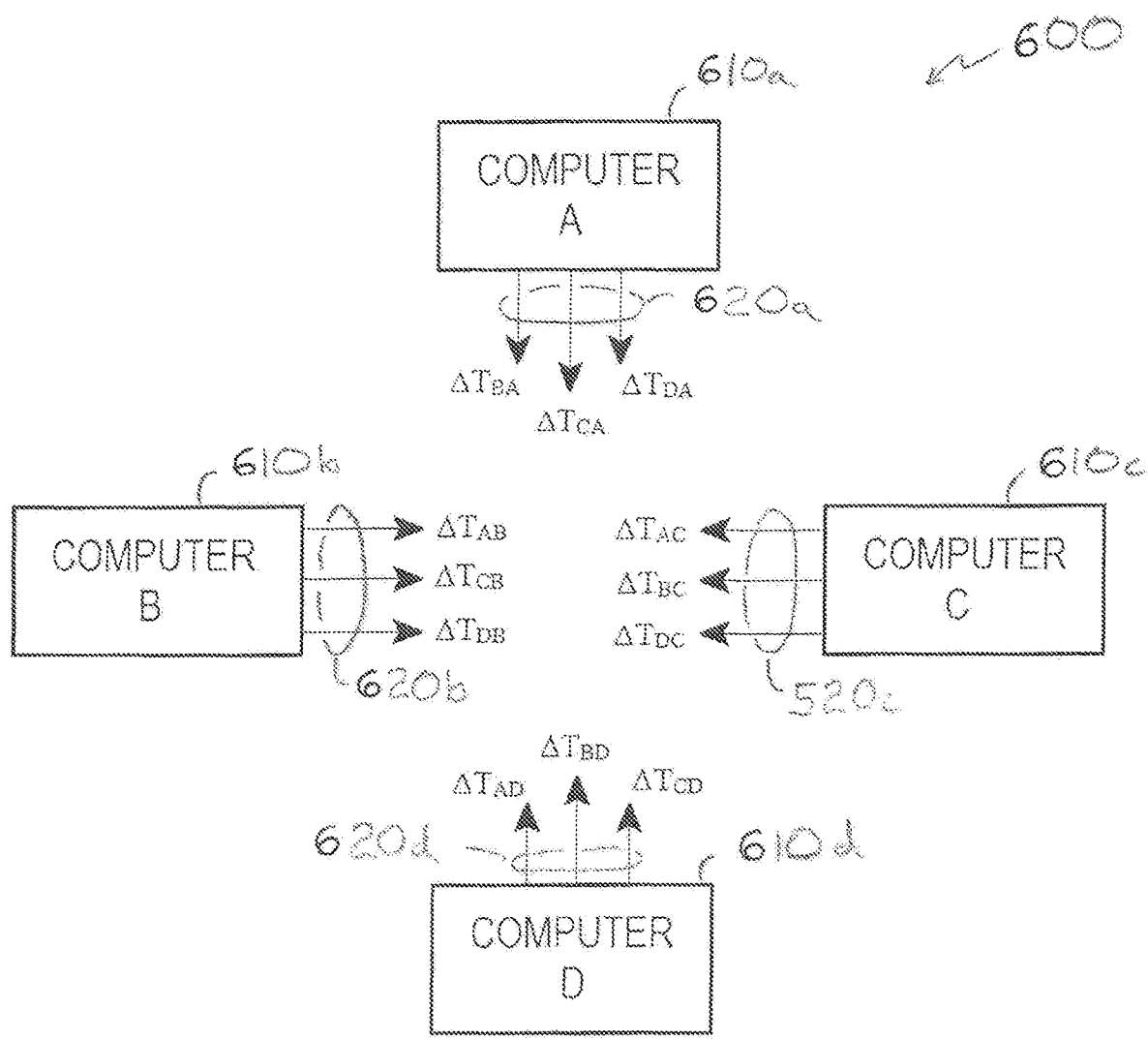
FIG. 7 is a schematic diagram of another example communications exchange of timing information between computers of a fault tolerant computing system.

Referring to FIG. 7, each of the computers 610 of the example system 600 may populate its respective table of $\Delta T$ values by communications of timing information by various messages 620, for example, via the communications channel 120. For example, at various intervals, each of the computers 610 may communicate each of the various $\Delta T$ values it calculated. As above, each respective computer 610 may calculate a $\Delta T$ value when it receives various communications, for example, such as the communications 310, 320 of FIG. 3. Such communications may be dedicated for the purpose of determining and sharing timing information in various embodiments, but in some embodiments any communication may include a transmit time from which a $\Delta T$ value may be calculated, and communications for other purposes may include one or more fields for the communication of $\Delta T$ values. Accordingly, each of the computers 610 may calculate $\Delta T$ values based upon any received communication and/or may communicate its calculated $\Delta T$ values by including them in any other communication, according to various embodiments.

In some embodiments, the communications channel 120 may be a shared medium such that each message 620 sent by a computer 610 is receivable by each of the other computers 610. Accordingly, each of the computers 610 receives, over time, a complete set of $\Delta T$ values. In other embodiments, the communications channel 120 may be comprised of point-to-point communication links and each computer 610 may send messages 620 individually to the others of the computers 610 such that each of the computers 610 receives, over time, a complete set of $\Delta T$ values. In various embodiments, one or more of the messages 620 may be broadcast and/or multi-cast directed messages, such that each of the computers 610 receives, over time, a complete set of $\Delta T$ values.

At least one benefit of maintaining a complete set of $\Delta T$ values, by each of the computers 610, is that such enables each of the computers 610 to be capable of calculating an offset value between any two of the computers 610 in the computing system 600, which further enables each of the computers 610 to monitor a condition of the system clock 230 of each of the computers 610. Accordingly, for example, the computers 610 may select the most stable of the system clocks 230 to be the leader clock at any given time, and may set their respective offset value 250 to provide a synchronized clock 260 in synch with the leader clock.

With respect to offsets between various system clocks and stability of one or more system clocks, an offset value that remains constant implies two system clocks are running at the same rate, for example, neither is faster than the other. An offset value that increases or decreases at a constant rate implies that one system clock is faster or slower than the other, respectively. An offset value that increases or decreases at a significant (though constant) rate may imply that one of the system clocks is out of specification, for example, running much faster or slower than its rated tolerance, and is failing to accurately keep time. An offset value that varies rapidly and/or erratically (for example, not at a constant increase or decrease) implies that at least one of the system clocks is not running at a constant rate and may be seriously out of specification, is failing, and/or has been compromised, for example, by environmental risks such as ionizing radiation. For example, a clock failure may be caused by a failure in either of the oscillator 210 or the counter 220, or in other components, such as by irradiation of a logic component, memory, register, etc.

In conventional systems, a single offset value maintained for synchronization to a leader clock may indicate a failure (for example, by increasing or decreasing rapidly or erratically) yet is incapable of indicating which clock is the source of the problem. For example, with respect to FIG. 1, if the computer 110b is synchronized to the computer 110a and an offset value indicates a clock error or failure, it is impossible for the computer 110b to determine whether its own system clock is out of specification or whether the leader clock (the computer 110a) is out of specification. With the advantage of aspects and embodiments described herein, however, various offset values to others of the computers and between others of the computers may indicate which clock is out of specification. For example, if the offsets for the computer 610d relative to all the others of the computers 610 are erratic, such implies that the system clock 230 of the computer 610d is failing. Accordingly, the computer 610d should not act as the leader clock, and if the computer 610d is the active leader clock, the system 600 may synchronize to a new leader.

A further advantage to maintaining a table of additional ΔT values (for example, between others of the computers 610) is that any respective one of the computers 610 may determine an offset to any of the others of the computers 610 even if communications to the other of the computers 610 is lost. For instance, the computer 610a may be a current leader clock, but in the instance that the computer 610c loses communication with the computer 610a, the computer 610c is capable of determining an offset to synchronize with the computer 610a via the table of ΔT values with respect to one or more of the other computers 610. For example, the computer 610c maintains ΔT values of itself relative to the computer 610b and also maintains ΔT values of the computer 610b to the computer 610a (the leader). Accordingly, the computer 610c may determine an appropriate offset to synchronize with the computer 610b and an appropriate offset for the computer 610b to synchronize with the computer 610a (the leader), and the sum of such offsets is an appropriate offset value for the computer 610c to synchronize with the computer 610a, even though direct communications to the computer 610a is lost.

Each of the computers 610 may determine an offset to synchronize with a leader clock via the table of ΔT values with respect to any number of the other computers 610. For example, while in the foregoing example the computer 610c determines an appropriate offset to synchronize with the computer 610a via a single intermediate computer (that is, the computer 610b), the computer 610c may determine an appropriate offset to synchronize with the computer 610a via any number of intermediate computers.

For example, the computer 610c may determine an appropriate offset to synchronize with the computer 610b, an appropriate offset for the computer 610b to synchronize with the computer 610d, and an appropriate offset for the computer 610d to synchronize with the computer 610a (the leader), and the sum of such offsets is an appropriate offset value for the computer 610c to synchronize with the computer 610a, even though direct communications to the computer 610a is lost.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A computing system comprising:
    an oscillator configured to provide an oscillating signal;
    a counter coupled to the oscillator and configured to maintain a running total of cycles of the oscillating signal, the running total of cycles being a system clock;
    a communications interface configured to send and receive information; and
    a processing component configured to:
        communicate with at least two other computing systems;
        determine a time differential with respect to each of the at least two other computing systems;
        maintain a synchronized clock with a selected one of the at least two other computing systems;
        monitor for a failure criterion with respect to the selected computing system;
        provide, to the at least two other computing systems responsive to detecting the failure criterion, a first vote to re-synchronize the synchronized clock with an alternate one of the at least two other computing systems other than the selected one of the at least two other computing systems;
        receive, from each computing system of the at least two other computing systems, a respective second vote to remain synchronized with the selected one of the at least two other computing systems or to re-synchronize with the alternate one of the at least two other computing systems; and
        select, based on the first vote and the second votes, a master computing system of the at least two other computing systems with which to maintain the synchronized clock.

2. The computing system of claim 1, wherein the processing component is further configured to:
    transmit and receive communications with the at least two other computing systems about an identity of the selected computing system to serve as a leader clock;
    establish the selected computing system as the leader clock based upon a voting scheme associated with the communications; and
    maintain the synchronized clock based upon the system clock and an offset to the leader clock.

3. The computing system of claim 1, wherein the processing component is further configured to:
    maintain the synchronized clock based upon the system clock and a first offset value derived from time differentials with respect to the selected computing system; and replace the first offset value with a second offset value derived from time differentials with respect to the alternate computing system responsive to detecting the failure criterion.

4. The computing system of claim 3, wherein the processing component is further configured to derive the first offset value based upon a first time differential to the selected computing system and a second time differential from the selected computing system.

5. The computing system of claim 4, wherein the processing component is further configured to derive the first offset value as an average of the first time differential and the second time differential.

6. The computing system of claim 3, wherein the processing component is further configured to maintain derived values of the first offset value and the second offset value simultaneously.

7. The computing system of claim 1, wherein the processing component is further configured to re-synchronize the synchronized clock with the selected one of the at least two other computing systems responsive to receiving, from the at least two other computing systems, at least two votes to remain synchronized with the selected one of the at least two other computing systems.

8. The computing system of claim 1, wherein the failure criterion is satisfied where a rate at which the first offset value changes exceeds a threshold.

9. A method of operating a computing system having a system clock, the method comprising:
communicating with at least two other computing systems;
determining a time differential with respect to each of the at least two other computing systems;
maintaining a synchronized clock with a selected one of the at least two other computing systems;
monitoring for a failure criterion with respect to the selected computing system; providing, to the at least two other computing systems responsive to detecting the failure criterion, a first vote to re-synchronize the synchronized clock with an alternate one of the at least two other computing systems other than the selected one of the at least two other computing systems,
receiving, from each computing system of the at least two other computing systems, a respective second vote to remain synchronized with the selected one of the at least two other computing systems or to re-synchronize with the alternate one of the at least two other computing systems; and
selecting, based on the first vote and the second votes, a master computing system of the at least two other computing systems with which to maintain the synchronized clock.

10. The method of claim 9, further comprising:
transmitting and receiving communications with the at least two other computing systems about an identity of the selected computing system to serve as a leader clock;
establishing the selected computing system as the leader clock based upon a voting scheme associated with the communications; and
maintaining the synchronized clock based upon the system clock and an offset to the leader clock.

11. The method of claim 9, further comprising:
maintaining the synchronized clock based upon the system clock and a first offset value derived from time differentials with respect to the selected computing system; and
replacing the first offset value with a second offset value derived from time differentials with respect to the alternate computing system responsive to detecting the failure criterion.

12. The method of claim 11, further comprising deriving the first offset value based upon a first time differential to the selected computing system and a second time differential from the selected computing system.

13. The method of claim 12, further comprising deriving the first offset value as an average of the first time differential and the second time differential.

14. The method of claim 11, further comprising maintaining derived values of the first offset value and the second offset value simultaneously.

15. The method of claim 9, further comprising re-synchronizing the synchronized clock with the selected one of the at least two other computing systems responsive to receiving, from the at least two other computing systems, at least two votes to remain synchronized with the selected one of the at least two other computing systems.

16. The method of claim 9 further comprising re-synchronizing the synchronized clock with the alternate one of the at least two other computing systems responsive to determining that a rate at which the first offset value changes exceeds a threshold.

17. A non-transitory computer-readable medium storing thereon sequences of computer-executable instructions for operating a computing system having a system clock, the sequences of computer-executable instructions including instructions that instruct at least one processor to:
communicate with at least two other computing systems;
determine a time differential with respect to each of the at least two other computing systems;
maintain a synchronized clock with a selected one of the at least two other computing systems;
monitor for a failure criterion with respect to the selected computing system;
provide, to the at least two other computing systems responsive to detecting the failure criterion, a first vote to re-synchronize the synchronized clock with an alternate one of the at least two other computing systems other than the selected one of the at least two other computing systems,
receive, from each computing system of the at least two other computing systems, a respective second vote to remain synchronized with the selected one of the at least two other computing systems or to re-synchronize with the alternate one of the at least two other computing systems; and
select, based on the first vote and the second votes, a master computing system of the at least two other computing systems with which to maintain the synchronized clock.

18. The non-transitory computer-readable medium of claim 17, wherein the instructions are further configured to instruct the at least one processor to:
transmit and receive communications with the at least two other computing systems about an identity of the selected computing system to serve as a leader clock;
establish the selected computing system as the leader clock based upon a voting scheme associated with the communications; and
maintain the synchronized clock based upon the system clock and an offset to the leader clock.

19. The non-transitory computer-readable medium of claim 17, wherein the instructions are further configured to instruct the at least one processor to:

maintain the synchronized clock based upon the system clock and a first offset value derived from time differentials with respect to the selected computing system; and replace the first offset value with a second offset value derived from time differentials with respect to the alternate computing system responsive to detecting the failure criterion.

20. The non-transitory computer-readable medium of claim 19, wherein the instructions are further configured to instruct the at least one processor to:

derive the first offset value based upon a first time differential to the selected computing system and a second time differential from the selected computing system.

* * * * *